US010379986B2

(12) United States Patent
Zou et al.

(10) Patent No.: US 10,379,986 B2
(45) Date of Patent: Aug. 13, 2019

(54) HARDWARE MONITORING SYSTEM AND METHOD THEREFOR

(71) Applicants: INVENTEC (PUDONG) TECHNOLOGY CORPORATION, Shanghai (CN); INVENTEC CORPORATION, Taipei (TW)

(72) Inventors: Xiaobing Zou, Shanghai (CN); Yingxian Han, Shanghai (CN); Longlong Xie, Shanghai (CN); Chia-Hsing Chen, Shanghai (CN); Jianbin Ni, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 42 days.

(21) Appl. No.: 15/655,309

(22) Filed: Jul. 20, 2017

(65) Prior Publication Data

US 2018/0089048 A1  Mar. 29, 2018

(30) Foreign Application Priority Data

Sep. 26, 2016 (CN) .......................... 2016 1 0850364

(51) Int. Cl.
  *G06F 11/00* (2006.01)
  *G06F 11/30* (2006.01)
  *H05K 7/20* (2006.01)
  *G06F 1/20* (2006.01)

(52) U.S. Cl.
  CPC .......... *G06F 11/3058* (2013.01); *G06F 1/206* (2013.01); *H05K 7/20209* (2013.01); *H05K 7/20836* (2013.01); *G06F 1/20* (2013.01)

(58) Field of Classification Search
  CPC ........ G06F 11/3058; G06F 1/20; G06F 1/206; H05K 7/20209; H05K 7/20836
  See application file for complete search history.

(56) References Cited

U.S. PATENT DOCUMENTS 7,661,878 B1 * 2/2010 Lall .......................... G01K 7/01
                                                                    374/170
2004/0267483 A1 * 12/2004 Percer ................ G01R 31/3173
                                                                    702/118

* cited by examiner

*Primary Examiner* — Mukundbhai G Patel
*Assistant Examiner* — Zhengfu J Feng
(74) *Attorney, Agent, or Firm* — Muncy, Geissler, Olds & Lowe, P.C.

(57) ABSTRACT

A hardware monitoring system and a method therefor are disclosed. The hardware monitoring method includes: sensing a first temperature value of a first temperature area by a first temperature sensor and sensing a second temperature value of a second temperature area by a second temperature sensor; reading and compensating for the second temperature value by a complex programmable logic device (CPLD); and reading the first temperature value and the compensated second temperature value and controlling heat dissipation of the computer system based on the first temperature value and the compensated second temperature value, by a hardware monitor. In this method, temperature values of different areas are sensed with multiple temperature sensors and are read and modified by the CPLD, thereby allowing temperature compensation for the temperature sensors and addressing the problem of inability to individually compensate for temperature values of different areas.

17 Claims, 4 Drawing Sheets

Fig. 4

HARDWARE MONITORING SYSTEM AND METHOD THEREFOR

CROSS-REFERENCES TO RELATED APPLICATIONS

This application claims the priority of Chinese patent application number 201610850364.8, filed on Sep. 26, 2016, the entire contents of which are incorporated herein by reference.

TECHNICAL FIELD

The present invention relates to a computer system and, in particular, to a hardware monitoring system and method therefor for a server.

BACKGROUND

In a computer system, the temperatures, voltages and fan speeds of hardware devices are monitored by a hardware monitoring module. As a branch of computers, servers utilize baseboard management control (BMC) chips as hardware monitoring functions for their motherboards.

During the production and development of servers, the manufacturers tend to produce multiple versions of their products, such as high-configuration and low-configuration versions, in order to meet different needs of users. Major differences between these configurations lie in hardware monitoring capabilities and costs.

At present, most low-configuration servers use one of the following solutions for hardware monitoring:

1) a customized BMC chip, which costs much;

2) a micro-control unit (MCU) such as a hardware monitor capable of monitoring the temperatures of memories, a central processing unit (CPU), a platform path hub (PCH) and thermal sensors, which usually requires the compatibility with multiple protocols such as those for system management bus (SMbus) interfaces, inter-integrated circuit (I²C) interfaces and platform environment control interfaces (PECIs), resulting in a long development cycle;

3) a dedicated embedded controller (EC), which has some redundant capabilities and is thus also costly, despite its capabilities of integrating a host of protocols including the SMbus, I²C and PECI protocols;

4) a low-cost hardware monitor, whose temperature sensors may not be able to monitor an adequate number of sites, and thus may not meet the requirement of the server. In addition, the low-cost hardware monitor fails to provide each of the temperature sensors with an independent temperature compensation value, leading to temperature differences between different areas that are too significant to allow reasonable weights for the control of fans. For example, the temperature of the memory area is generally in the range from 60° C. to 75° C., and a temperature threshold for fan acceleration for this area is set to 65° C. Additionally, as the temperature of an input/output (I/O) area generally ranges from 50° C. to 65° C., its fan acceleration temperature threshold is set to 55° C. If a temperature compensation value of 10° C. is not provided to the I/O area, when these areas are controlled by the same pulse width modulation (PWM) interface, the control will be always dominated by the area with the higher temperature, leaving the sensor data from the area with the lower temperature threshold ignored.

Therefore, there is a need to develop a new hardware monitoring system for low-configuration servers, which can address the issue of unbalanced weights for fan control.

SUMMARY OF THE INVENTION

It is an objective of the present invention to provide a hardware monitoring system and a method therefor. The hardware monitoring system is provided primarily for low-configuration servers to enable the monitoring of hardware heat dissipation without using BMC chips. In addition, the system and method are capable of temperature compensation for different areas, which solves the problem of unbalanced weights for fan control and improves heat dissipation for the low-configuration servers.

In order to achieve the above and other related objectives, the present invention provides a hardware monitoring method for monitoring a computer system, comprising:

sensing a first temperature value of a first temperature area by a first temperature sensor and sensing a second temperature value of a second temperature area by a second temperature sensor;

reading and compensating for the second temperature value by a complex programmable logic device; and reading the first temperature value and the compensated second temperature value and controlling heat dissipation of the computer system based on the first temperature value and the compensated second temperature value, by a hardware monitor.

Preferably, the hardware monitoring method further comprises:

electrically connecting the complex programmable logic device to an expandable component which is connected with to a third temperature sensor and sensing a third temperature value of a third temperature area using the third temperature sensor;

reading the third temperature value from the expandable component and compensating for the third temperature value, by the complex programmable logic device;

comparing the compensated third temperature value with the compensated second temperature value and feeding back a greater temperature value of the compensated second and third temperature values to the hardware monitor, by the complex programmable logic device; and controlling heat dissipation of the computer system by the hardware monitor based on the greater temperature value and the first temperature value.

Preferably, the hardware monitoring method further comprises:

connecting the expandable component to a plurality of third temperature sensors and sensing a plurality of third temperature values of the third temperature area by the plurality of third temperature sensors, reading the plurality of third temperature values and compensating for each of the plurality of third temperature values by the complex programmable logic device; and comparing the compensated second temperature value with the plurality of compensated third temperature values and feeding back a greatest temperature value of the compensated second and third temperature values to the hardware monitor, by the complex programmable logic device.

Preferably, the hardware monitoring method further comprises, subsequent to reading the second temperature value and the plurality of third temperature values:

storing the second temperature value and the plurality of third temperature values in a storage unit, by the complex programmable logic device;

seeking a first offset corresponding to the second temperature value from the storage unit and compensating for the second temperature value based on the first offset to generate a fourth temperature value, by the complex programmable logic device;

seeking a plurality of second offsets corresponding to the plurality of third temperature values from the storage unit and compensating for the plurality of third temperature values based on the plurality of second offsets to generate a plurality of fifth temperature values, by the complex programmable logic device, and comparing the fourth temperature value with the plurality of fifth temperature values and feeding back a greatest temperature value of the fourth and fifth temperature values to the hardware monitor, by the complex programmable logic device.

Preferably, the hardware monitoring method comprises:

arranging at least one of the plurality of third temperature sensors in an I/O area to sense at least one of the third temperature values for the I/O area;

arranging a further one of the plurality of third temperature sensors in an area where the expandable component is located to sense a further one of the plurality of third temperature values for the expandable component; and wherein compensating for each of the plurality of third temperature values comprises:

seeking a third offset from the storage unit and compensating for the further one of the plurality of third temperature values for the expandable component based on the third offset, by the complex programmable logic device; and seeking at least one fourth offset from the storage unit and compensating for the at least one of the plurality of third temperature values for the I/O area based on the at least one fourth offset, by the complex programmable logic device; and wherein the plurality of second offsets include the third offset and the at least one fourth offset.

Preferably, the hardware monitoring method comprises:

arranging the second temperature sensor in an area where a platform controller hub is located to sense the second temperature value for the platform controller hub; and seeking the first offset corresponding to the second temperature value for the platform controller hub from the storage unit and compensating for the second temperature value based on the first offset, by the complex programmable logic device.

Preferably, in the hardware monitoring method, the complex programmable logic device is electrically connected to the platform controller hub to allow configuration of at least one of the first and second offsets in the storage unit through the platform controller hub.

Preferably, in the hardware monitoring method, the computer system comprises a fan module; and the hardware monitor controls the heat dissipation by accessing a fan speed table and controlling a fan speed of the fan module based on the greater temperature value and the first temperature value.

Preferably, in the hardware monitoring method, the hardware monitor and the complex programmable logic device are initialized through a platform controller hub.

Preferably, in the hardware monitoring method, the computer system is a server.

Preferably, in the hardware monitoring method, the hardware monitor is configured to send an alert signal to the complex programmable logic device upon an operational parameter of the server exceeding a default value, and the complex programmable logic device is configured to cease data reading operations according to the alert signal.

In order to achieve the above and other related objectives, the present invention also provides a hardware monitoring system for a computer system, comprising:

a hardware monitor, having a first temperature sensor for sensing a first temperature value of a first temperature area; and a complex programmable logic device electrically connected to the hardware monitor, the complex programmable logic device having a second temperature sensor for sensing a second temperature value of a second temperature area, wherein the complex programmable logic device is configured to read and compensate for the second temperature value, and the hardware monitor is configured to read the first temperature value and the compensated second temperature value and to control heat dissipation of the computer system based on the first temperature value and the compensated second temperature value.

Preferably, in the hardware monitoring system, the complex programmable logic device is further electrically connected to an expandable component which is connected to a third temperature sensor for sensing a third temperature value of a third temperature area; and wherein: the complex programmable logic device is configured to read the third temperature value from the expandable component and compensate for the third temperature value; the complex programmable logic device is further configured to compare the compensated third temperature value with the compensated second temperature value and feeds back a greater temperature value of the compensated second and third temperature values to the hardware monitor; and the hardware monitor is configured to control heat dissipation of the computer system based on the greater temperature value and the first temperature value.

Preferably, in the hardware monitoring system, the complex programmable logic device further comprises: a first $I^2C$ interface for electrically connecting to the expandable component to allow reading of the third temperature value via the first $I^2C$ interface; a second $I^2C$ interface for electrically connecting to the second temperature sensor to allow reading of the second temperature value via the second $I^2C$ interface; and a first system management bus interface for electrically connecting to the hardware monitor to provide the greater temperature value to the hardware monitor.

Preferably, in the hardware monitoring system, the complex programmable logic device further comprises a storage unit for storing the second temperature value and third temperature value; the storage unit further stores a first offset and a second offset; and the complex programmable logic device is configured to compensate for the second temperature value based on the first offset and to compensate for the third temperature value based on the second offset.

Preferably, in the hardware monitoring system, the complex programmable logic device further comprises a second system management bus interface for electrically connecting to a platform controller hub to allow configuration of at least one of the offsets stored in the storage unit via the second system management bus interface.

Preferably, in the hardware monitoring system, the third temperature area comprises an I/O area and an area where the expandable component is located; the second temperature area comprises an area where a platform controller hub is located; and the first temperature area comprises at least one of: an area where a central process unit is located, an area where a memory is located, an area where the hardware monitor is located, and an area where a thermal diode is located.

Preferably, in the hardware monitoring system, the computer system comprises a fan module; the hardware monitor further comprises a storage module for storing a fan speed table; and the hardware monitor is configured to control the heat dissipation by accessing the fan speed table and controlling a fan speed of the fan module based on the greater temperature value and the first temperature value.

Preferably, in the hardware monitoring system, the hardware monitor further comprises: a platform environment control interface for electrically connecting to the first temperature sensor; a third system management bus interface for electrically connecting to the complex programmable logic device; and a fourth system management bus interface for electrically connecting to a platform controller hub to allow initialization of the hardware monitor via the fourth system management bus interface.

Compared to the prior art, the hardware monitoring system and hardware monitoring method provided in the present invention offer the following benefits:

Firstly, the subject matter of the present invention combines a hardware monitor with a complex programmable logic device (CPLD), utilizes a plurality of temperature sensors to sense temperature values of different areas and reads out the temperature values for modification by the CPLD. In such a manner, temperature compensation for the different areas is enabled, and the problem of inability to individually compensate for temperature values of different areas arising from the use of existing computer systems is addressed.

Secondly, the CPLD is capable of independently compensating for the temperature sensed by each of the temperature sensors, reducing the temperature differences between the areas. Therefore, increased balance between weights for temperature control during the heat dissipation control process is achieved, which allows better heat dissipation of the computer system.

Thirdly, in the subject matter of the present invention, the CPLD is electrically connected to a expandable component which is connected to one or more third temperature sensors, enabling temperature monitoring for more areas. Moreover, the CPLD is capable of independently compensating for the temperature value sensed by each third temperature sensor. This, on one hand, enlarges the temperature monitoring coverage and, on the other hand, allows compensation for multiple temperature values, thereby further enhancing heat dissipation of the computer system.

DETAILED DESCRIPTION

In order for the objectives, advantages and features of the present invention to be more apparent, the hardware monitoring system and method therefor proposed in the present invention are described below in greater detail with reference to FIGS. 1 to 4. Note that the figures are provided in a very simplified form not necessarily presented to scale, with the only intention of facilitating convenience and clarity in explaining the embodiments of the invention.

Figure 1:
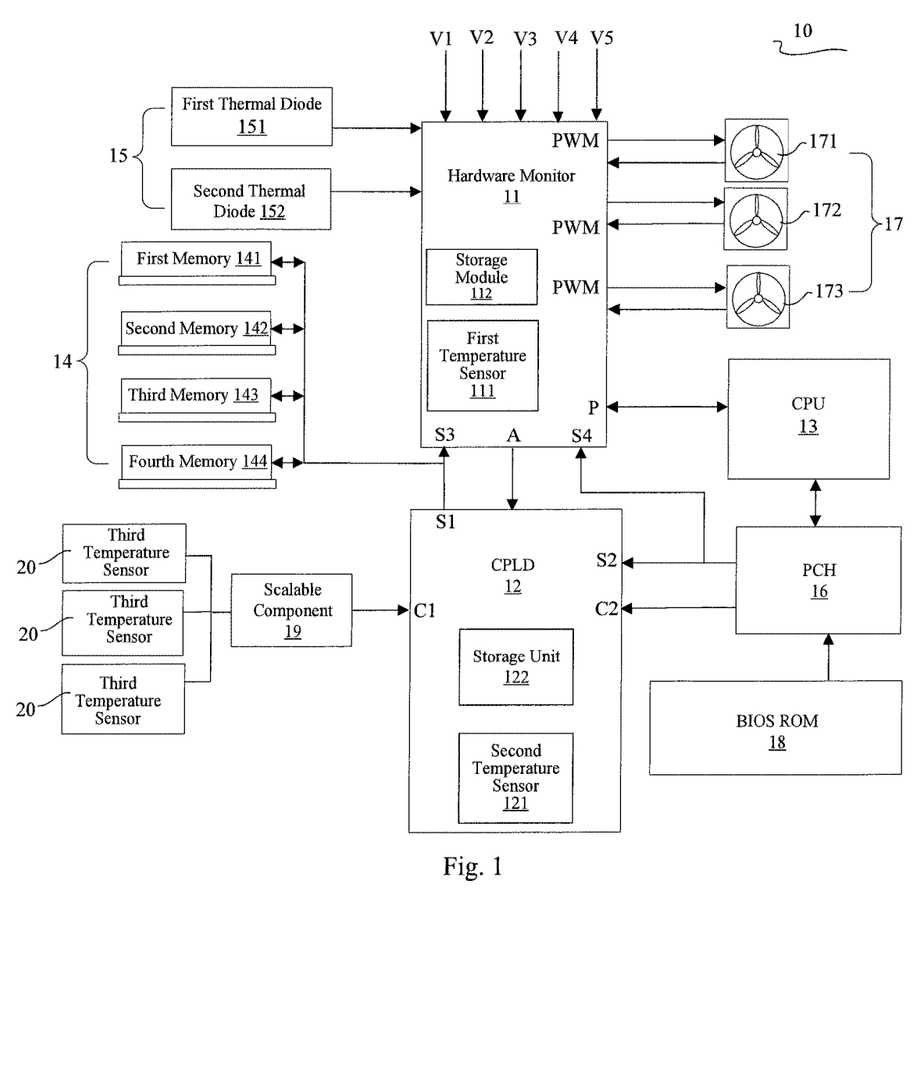
FIG. 1 is a structural block diagram of a hardware monitoring system according to an embodiment of the present invention.

FIG. 1 is a structural block diagram of a hardware monitoring system according to an embodiment of the present invention. As shown in FIG. 1, the hardware monitoring system 10 includes a hardware monitor 11 and a complex programmable logic device (CPLD) 12. The hardware monitoring system 10 functions primarily to monitor heat dissipation of a computer system. For example, it monitors the temperature of a server board or other appropriate electronic device. The present invention is particularly suitable for monitoring heat dissipation of a low-configuration server at a low cost. A "low-configuration server" refers to a server that is lower than a "high-configuration server" in terms of cost, performance and other metrics. The hardware monitor 11 is electrically connected to the CPLD 12.

In one embodiment, the CPLD 12 is electrically connected to the hardware monitor 11 via, but not limited to, a first system management bus (SMBus) interface S1. The CPLD 12 may also be electrically connected to the hardware monitor 11 through another suitable transmission interface including a general purpose I/O bus interface and an inter-integrated circuit ($I^2C$) interface. It will be appreciated that the hardware monitor 11 has, accordingly, a third SMbus interface S3 for electrically connecting to the first SMbus interface S1 via an SMbus.

The hardware monitor 11 has a first temperature sensor 111 configured to sense a first temperature value of a first temperature area. In this embodiment, the first temperature area includes one or more of an area where a central process unit (CPU) 13 is located, an area where a memory 14 is located, an area where the hardware monitor 11 is located and an area where a thermal diode 15 is located.

It will be appreciated that in case of the first temperature area including several of the above-mentioned areas, a plurality of first temperature sensors 111 may be accordingly provided and at least one first temperature sensor 111 may be provided in each of the areas (i.e., when multiple components are operating in the first temperature area, the temperature of each of the components may be sensed with at least one first temperature sensor 111). Here, the first temperature area is usually an area where an electronic component or assembly generating more heat than others in the computer system is located.

In this embodiment, when the first temperature sensor 111 is configured to sense a temperature of the area where the CPU is located, the hardware monitor 11 is electrically connected to the first temperature sensor 111 via a platform environment control interface (PECI) P, so that the first temperature value is read via the interface P during operation of the CPU. When the first temperature sensor 111 is configured to sense a temperature of the area where the memory 14 is located, the hardware monitor 11 is electrically connected to the first temperature sensor 111 via the third SMbus interface S3, so that the first temperature value is read via the interface S3 during operation of the memory 14. That is, the CPLD 12 shares the third SMbus interface S3 with the first temperature sensor 111 that reads the temperature of the memory 14.

Further, according to the hardware monitoring system 10 shown in FIG. 1, the hardware monitor 11 has eight first temperature sensors 111, in which two first temperature sensors 111 are adapted to sense the first temperature values for two thermal diodes 15 (a first thermal diode 151 and a second thermal diode 152) during operation thereof, four first temperature sensors 111 are adapted to sense the first temperature values for four memories 14 (a first memory 141, a second memory 142, a third memory 143 and a fourth memory 144) during their operation, one first temperature sensor 111 is adapted to sense the first temperature value for the hardware monitor 11 during operation thereof, and the rest one first temperature sensor 111 is adapted to sense the first temperature value for the CPU 13 during its operation.

The hardware monitor 11 further has five analog input ports V1, V2, V3, V4, V5 for respectively monitoring voltages in 12V, 5V, 2.5V, VTT and Vccp channels. Furthermore, the hardware monitor 11 is selected as an NCT7491 monitor with 24 pins, a QFN or QSOP package and an operating voltage ranging from 3.0 V to 3.6 V.

Additionally, the CPLD 12 has a second temperature sensor 121 configured to sense a second temperature value of a second temperature area. In this embodiment, the second temperature area includes the following area: an area where a platform controller hub (PCH) 16 is located. In other words, the second temperature value represents a temperature of the PCH 16 during its operation.

In this embodiment, the CPLD 12 further has a storage unit 122. The CPLD 12 reads the second temperature value sensed by the second temperature sensor 121 and stores the second temperature value in the storage unit 122. The storage unit 122 may either be an internal register or a built-in memory. The CPLD 12 seeks a first offset in the storage unit 122 and modifies the second temperature value based on the first offset.

In one embodiment, after the CPLD 12 reads out the second temperature value sensed by the second temperature sensor 121, it looks up a Temperature—Offset table stored in the storage unit 122 to find the first offset corresponding to the PCH 16 and modifies the second temperature value based on the found first offset. The modified second temperature value is then provided to and read by the hardware monitor 11. The hardware monitor 11 reads the first temperature value and the modified second temperature value and then controls heat dissipation of the computer system based on the first temperature value and the modified second temperature value.

Figure 2:
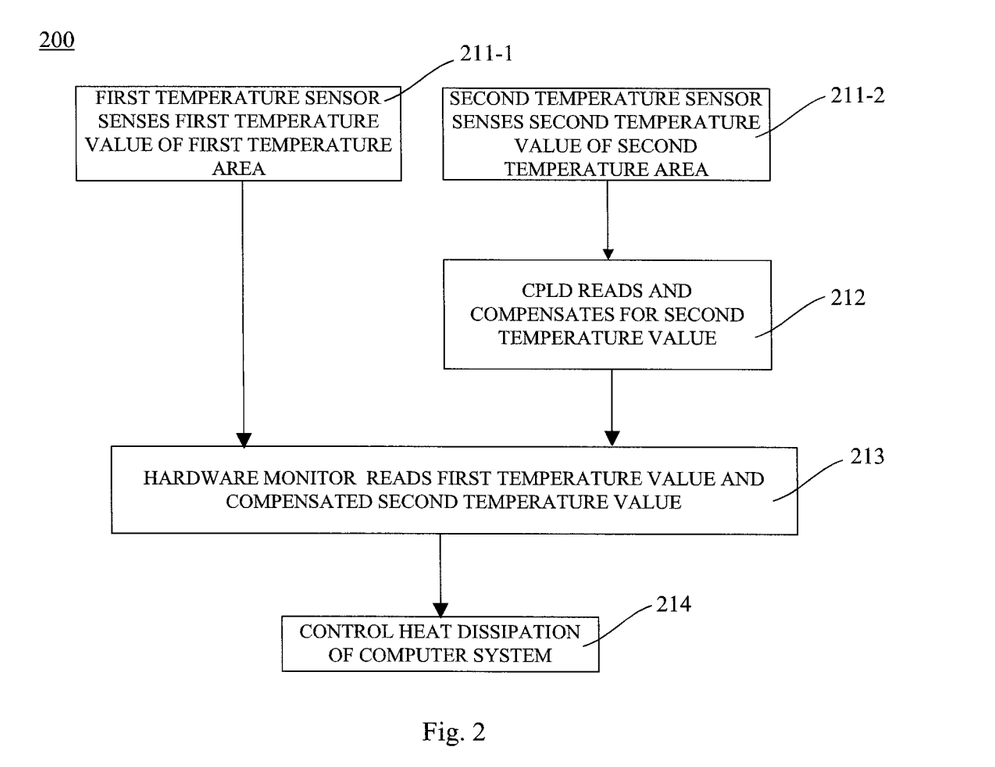
FIG. 2 is a flowchart illustrating a monitoring method for a hardware monitoring system according to an embodiment of the present invention.

Specifically, reference can be made to FIG. 2, a flowchart illustrating a monitoring method for a hardware monitoring system according to an embodiment of the present invention, for the hardware monitoring principles disclosed in the above embodiments. As shown in FIG. 2, the hardware monitoring method 200 in this embodiment includes the steps as detailed below. First of all, step 211 consists of: step 211-1, in which the first temperature sensor 111 senses the first temperature value of the first temperature area; and step 211-2, in which the second temperature sensors 121 senses the second temperature value of the second temperature area. In step 212, the CPLD 12 reads out the second temperature value for compensation (herein, interchangeably used with "modification"). In step 213, the hardware monitor 11 reads out the first temperature value and the compensated second temperature value. In step 214, the hardware monitor 11 controls heat dissipation of the computer system based on the first temperature value and the compensated second temperature value.

In one embodiment, the computer system comprises a fan module 17 including one or more fans. Specifically, the fan module 17 may include a system fan 171, a CPU fan 172 and a redundant fan 173. Preferably, the hardware monitor 11 controls operating speeds of these fans using pulse width modulation (PWM) interfaces PWM. More specifically, the hardware monitor 11 determines a fan speed corresponding to the first temperature value and to the modified second temperature value by looking up a fan speed table and controls the operation of the fan based on the fan speed. Optionally, the fan speed table may be stored in a storage module 112 in the hardware monitor 11.

In this embodiment, the PCH 16 in the computer system is electrically connected to the CPLD 12 in order to enable initialization of the CPLD 12. The initialization may include configuring first offsets and below-described second offsets for the PCH 16 in the storage unit 122. Alternatively, the PCH 16 may also read out the second temperature value(s) stored in the CPLD 12 for facilitating heat dissipation analysis. However, the function of the PCH 16 is not limited thereto, and the present invention is not particularly limited in this regard. In one embodiment of the present invention, the CPLD 12 is electrically connected to the PCH 16 via a second SMbus interface S2.

Similarly, the PCH 16 is also electrically connected to the hardware monitor 11 in order to allow initialization of the hardware monitor 11. The initialization may include configuring the fan speed table in the hardware monitor 11. In this embodiment, the PCH 16 may obtain the fan speed table from a basic input/output system read-only memory (BIOS ROM) 18 and store it in the hardware monitor 11.

In one embodiment of the present invention, the hardware monitor 11 is electrically connected to the PCH 16 via a fourth SMbus interface S4, and the CPLD 12 and the hardware monitor 11 are electrically connected to the PCH 16 via the same SMbus interface in the PCH 16.

In addition, in the case of the SMbus interfaces being employed as transmission interfaces for electrically connecting the hardware monitor 11 to the CPLD 12 and the PCH 16, when the hardware monitor 11 reads out the modified second temperature value from the CPLD 12, the hardware monitor 11 may act as a host controller on the SMbus, with the PCH 16 and another component on the bus as a slave controller. As such, the hardware monitor 11 is allowed to read out the temperature value from the CPLD 12 or the other component via the SMbus. Upon a temperature reading request from the hardware monitor 11, the hardware monitor 11 will switch to act as a host controller, with the PCH 16 switching to act as a slave controller, so that the hardware monitor 11 can read the modified second temperature value stored in the storage unit 122 of the CPLD 12 via the SMbus.

In preferred embodiments, the hardware monitoring system 10 further comprises an expandable component 19 electrically connected to each of the CPLD 12 and a third temperature sensor 20 configured to sense a third temperature value of a third temperature area. The CPLD 12 reads out the third temperature value from the expandable component 19 and modifies it. Specifically, the CPLD 12 seeks a second offset from the storage unit 122 and modifies the third temperature value based on the second offset. The expandable component 19 may be optionally an EMC1464 element with multiple expandable interfaces for electrical connection to a plurality of third temperature sensors 20.

In addition, the CPLD 12 may compare the modified third temperature value with the modified second temperature value and feed the greater one back to the hardware monitor 11. The hardware monitor 11 then controls heat dissipation of the computer system based on the greater value and the read first temperature value.

Figure 3:
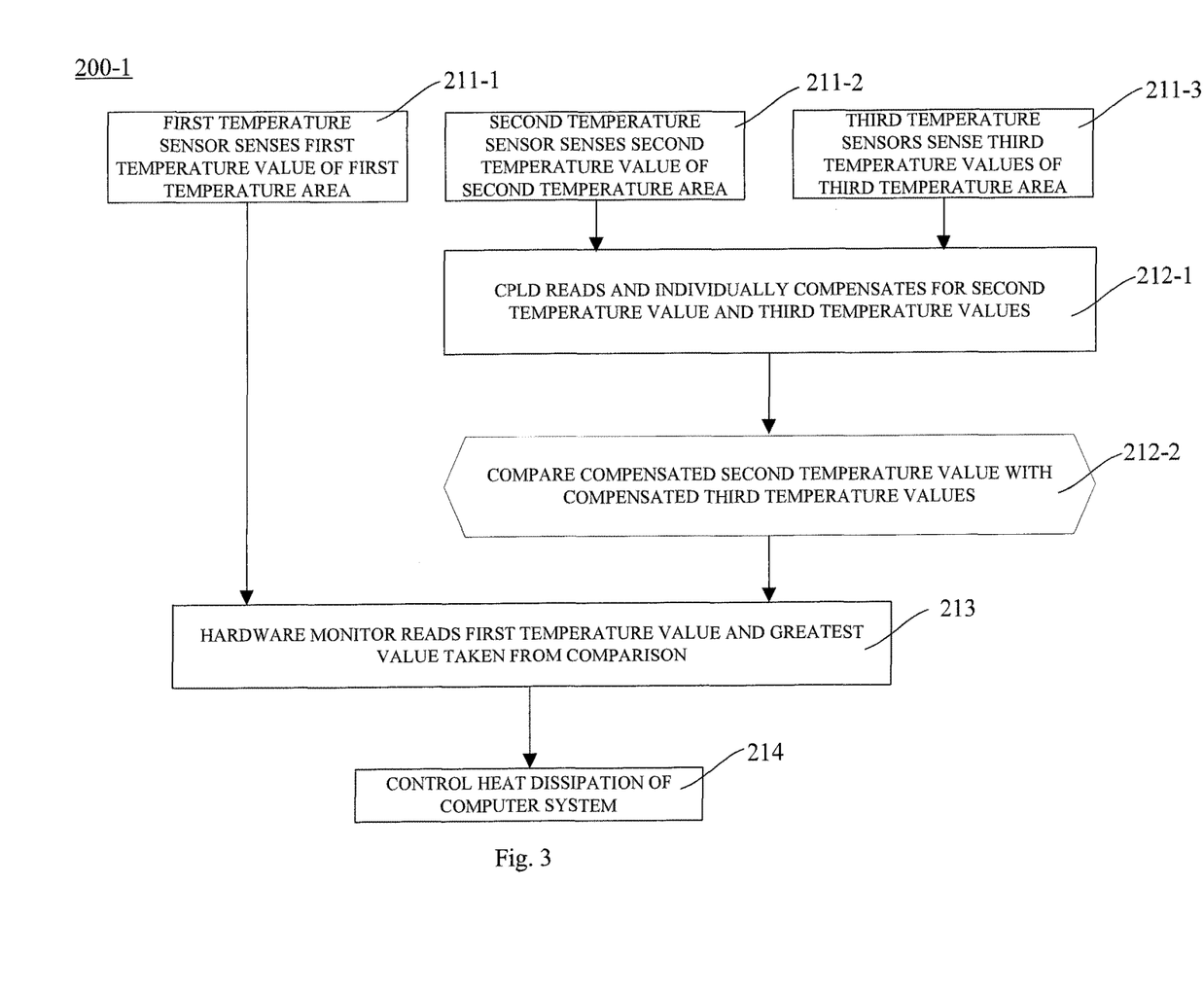
FIG. 3 is a flowchart illustrating a monitoring method for a hardware monitoring system according to a preferred embodiment of the present invention.

Reference is further made to FIG. 3, a flowchart illustrating a monitoring method for a hardware monitoring system according to a preferred embodiment of the present invention. According to the hardware monitoring method 200-1 shown in FIG. 3, step 211 additionally includes step 211-3, in which the third temperature sensor 20 senses the third temperature value of the third temperature area. Differing from FIG. 2, step 212 includes: step 212-1, in which, apart from the second temperature value, the CPLD 12 further reads out the third temperature value, and compensates for both of the second temperature value and third temperature value; and step 212-2, in which, the CPLD 12 compares the compensated second temperature value and the compensated third temperature value and takes the greater one. Afterward, in step 213, the hardware monitor 11 reads out the first temperature value and the greater temperature value taken from the comparison. Subsequently, in step 214, the hardware monitor 11 controls heat dissipation of the computer system based on the first temperature value and the greater temperature value taken from the comparison.

Further, the expandable component 19 may be connected with a plurality of third temperature sensors 20 for sensing third temperature values of a plurality of operating components in the third temperature area. Wherein, one of the third temperature sensors 20 is configured to sense the third temperature value for the expandable component 19 during its operation. Optionally, at least one of the third temperature sensors 20 may be adapted to sense the third temperature value for an I/O area during operation thereof. For the sake of simplicity, hereinafter, the modified second temperature value is defined as a fourth temperature value, and the modified third temperature value as a fifth temperature value.

In the scenario with a plurality of third temperature sensors 20, the CPLD 12 reads a plurality of third temperature values from the expandable component 19 and modifies each of the third temperature values to obtain a plurality of fifth temperature values. After that, the fourth temperature value is compared with the plurality of fifth temperature values, and the greatest temperature value is taken therefrom which may be read during subsequent control of heat dissipation.

More specifically, after the second temperature value is read out, the CPLD 12 stores it in the storage unit 122 and then seeks a first offset corresponding to the second temperature value from the storage unit 122. The second temperature value is then modified based on the first offset, resulting in a fourth temperature value. Additionally, the CPLD 12 reads out and stores one or more third temperature values in the storage unit 122. Next, second offset(s) corresponding to the third temperature value(s) is/are sought and used to modify the third temperature value(s), resulting in fifth temperature value(s). It is to be noted that, in the scenario with a plurality of third temperature values, the CPLD 12 seeks second offsets each corresponding to one of the third temperature values and then modifies them individually.

For example, a third temperature sensor 20 is provided in the I/O area, and another third temperature sensor 20 in an area where the expandable component 19 is located. In this case, the CPLD 12 seeks a third offset from the storage unit 122 and, based thereon, modifies the third temperature value sensed during operation of the expandable component 19. In addition, the CPLD 12 seeks a fourth offset in the storage unit 122 and modifies the third temperature value corresponding to the I/O area based on the fourth offset. In this case, in other words, one third temperature sensor 20 senses a temperature of the expandable component 19 in operation, and another third temperature sensor 20 senses a temperature of the I/O area during operation thereof. It will be appreciated that the second offsets include the third and fourth offsets.

In one embodiment, the first offset is based on the difference between an actual temperature of the PCH 16 and the temperature thereof sensed by the second temperature sensor 121. Specifically, assuming the actual temperature of the PCH 16 rises to 60° C., while the second temperature value sensed by the second temperature sensor 121 is only 54° C., if the hardware monitor 11 controlled the fan module 17 based on the second temperature value, i.e., 54° C., the fan would not be activated or remain operating at an inadequate speed, making the PCH 16 not sufficiently cooled and exposed to a risk of overheat. The aforesaid offset enables compensation for such difference between the temperature value sensed by the temperature sensor and the actual temperature.

The offsets may also be relevant to the temperature tolerance of the operating components. For example, if the actual temperature of the PCH 16 reaches 60° C., while the second temperature value sensed by the second temperature sensor 121 is only 54° C., and the fan is therefore not activated, it will be likely for the PCH 16 to be damaged. However, if the actual temperature of an operating component in the third temperature area that is more temperature-tolerant than the PCH 16 rises to 60° C., while a third temperature value thereof sensed by a third temperature sensor 20 is 56° C., and thus the fan is not activated, the probability for the operating component to be damaged will be lower than that for the PCH 16. Therefore, modifying the temperature values based on the offsets can not only prevent the adverse consequences from the differences between the temperatures sensed by the temperature sensors and the actual temperatures, but can also reduce the probability for less temperature-tolerant components to be damaged.

In one embodiment, the CPLD 12 is electrically connected to the expandable component 19 via a first I$^2$C interface C1 in order to read the third temperature value(s) sensed by the third temperature sensor(s) 20. Additionally, the CPLD 12 is electrically connected to the second temperature sensor 121 via a second I$^2$C interface C2 in order to read the second temperature value sensed by the second temperature sensor 121.

In one embodiment, when one of operational parameters of the computer system (e.g., voltage, current, temperature, fan speed, etc.) exceeds a default value, the hardware monitor 11 sends an alert signal (digital) to the CPLD 12, based on which, the CPLD 12 ceases its data reading operations. The hardware monitor 11 may have an alert interface A for transmitting the alert signal to the CPLD 12.

While several preferred embodiments of the present invention have been illustrated and described above, the invention is not limited to the scope of these disclosed embodiments, for example, to the described transmission interfaces between the hardware monitor, the CPLD and the PCH. In addition, the CPLD is not limited to being electrically connected to one expandable component, as it may also be electrically connected to a plurality of expandable components each connected to one or more third temperature sensors. Alternatively, the hardware monitor is not limited to being electrically connected to one CPLD and may be electrically connected to a plurality of CPLDs each operating in the same manner as described in the above embodiments. Note that when a hardware monitor is described in a previous embodiment as having a first temperature sensor, it is to be construed that the hardware monitoring systems of the subsequent embodiments also have such a first temperature sensor for sensing a first temperature value of a first temperature area. Similarly, when a CPLD is described in a previous embodiment as having a second temperature sensor, it is to be construed that the hardware monitoring systems of the subsequent embodiments also have such a second temperature sensor for sensing a second temperature value of a second temperature area.

Figure 4:
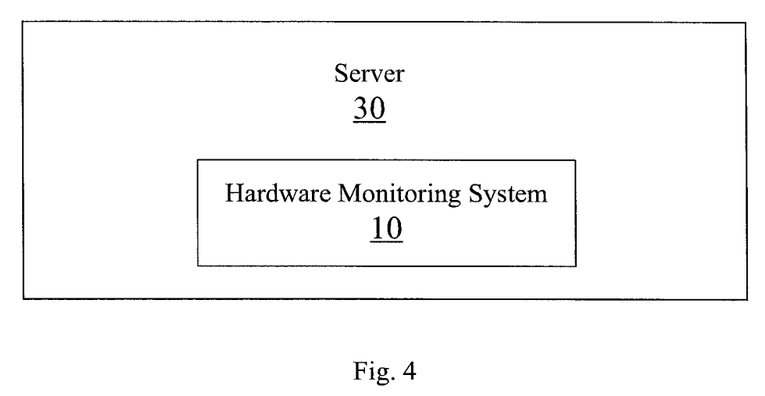
FIG. 4 is a structural block diagram of a server according to an embodiment of the present invention which incorporates a hardware monitoring system.

Furthermore, based on the hardware monitoring systems 10 disclosed in the foregoing embodiments, a server 30 is provided in embodiments. FIG. 4 shows a structural block diagram of a server according to an embodiment of the present invention. The server 30 employs a hardware monitoring system 10 according to one of the above embodiments to monitor heat dissipation of its hardware devices. Since the server 30 employs the hardware monitoring system 10, reference may be made to the foregoing embodiments for the same benefits as provided by the hardware monitoring system 10.

In summary, the hardware monitoring system of the present invention combines a hardware monitor with a CPLD, utilizes a plurality of temperature sensors to sense temperature values of different areas and reads out the temperature values for modification by the CPLD. In such a manner, the issue of unbalanced weights for fan control arising from temperature differences between the areas can be addressed.

In addition, the CPLD is capable of independently compensating for the temperature sensed by each of the temperature sensors, reducing the temperature differences between the areas. Therefore, increased balance between weights for temperature control during the heat dissipation control process is achieved, which allows better heat dissipation of the computer system.

Further, in the hardware monitoring system of the present invention, the CPLD is electrically connected to a expandable component which is connected to one or more third temperature sensors, enabling temperature monitoring for more areas. Moreover, the CPLD is capable of independently compensating for the temperature value sensed by each third temperature sensor. This, on one hand, enlarges the temperature monitoring coverage and, on the other hand, allows compensation for multiple temperature values, thereby further enhancing heat dissipation of the computer system.

The foregoing description presents merely preferred embodiments of the present invention and does not limit the scope of the invention in any sense. All changes or modifications made based on the above disclosure by those of ordinary skill in the art fall within the scope of the invention.

What is claimed is:

1. A hardware monitoring method for monitoring a computer system, comprising:
   sensing a first temperature value of a first temperature area by a first temperature sensor and sensing a second temperature value of a second temperature area by a second temperature sensor;
   reading and compensating for the second temperature value by a complex programmable logic device;
   reading the first temperature value and the compensated second temperature value and controlling heat dissipation of the computer system based on the first temperature value and the compensated second temperature value, by a hardware monitor;
   electrically connecting the complex programmable logic device to an expandable component which is connected to a third temperature sensor and sensing a third temperature value of a third temperature area using the third temperature sensor;
   reading the third temperature value from the expandable component and compensating for the third temperature value, by the complex programmable logic device;
   comparing the compensated third temperature value with the compensated second temperature value and feeding back a greater temperature value of the compensated second and third temperature values to the hardware monitor, by the complex programmable logic device; and
   controlling heat dissipation of the computer system by the hardware monitor based on the greater temperature value and the first temperature value.

2. The hardware monitoring method of claim 1, further comprising:
   connecting the expandable component to a plurality of third temperature sensors and sensing a plurality of third temperature values of the third temperature area by the plurality of third temperature sensors,
   reading the plurality of third temperature values and compensating for each of the plurality of third temperature values by the complex programmable logic device; and
   comparing the compensated second temperature value with the plurality of compensated third temperature values and feeding back a greatest temperature value of the compensated second and third temperature values to the hardware monitor, by the complex programmable logic device.

3. The hardware monitoring method of claim 2, wherein subsequent to reading the second temperature value and the plurality of third temperature values, the method further comprises:
   storing the second temperature value and the plurality of third temperature values in a storage unit, by the complex programmable logic device;
   seeking a first offset corresponding to the second temperature value from the storage unit and compensating for the second temperature value based on the first offset to generate a fourth temperature value, by the complex programmable logic device;
   seeking a plurality of second offsets corresponding to the plurality of third temperature values from the storage unit and compensating for the plurality of third temperature values based on the plurality of second offsets to generate a plurality of fifth temperature values, by the complex programmable logic device, and
   comparing the fourth temperature value with the plurality of fifth temperature values and feeding back a greatest temperature value of the fourth and fifth temperature values to the hardware monitor, by the complex programmable logic device.

4. The hardware monitoring method of claim 3, comprising:
   arranging at least one of the plurality of third temperature sensors in an I/O area to sense at least one of the third temperature values for the I/O area;
   arranging a further one of the plurality of third temperature sensors in an area where the expandable component is located to sense a further one of the plurality of third temperature values for the expandable component; and
   wherein compensating for each of the plurality of third temperature values comprises:

seeking a third offset from the storage unit and compensating for the further one of the plurality of third temperature values for the expandable component based on the third offset, by the complex programmable logic device; and seeking at least one fourth offset from the storage unit and compensating for the at least one of the plurality of third temperature values for the I/O area based on the at least one fourth offset, by the complex programmable logic device; and wherein the plurality of second offsets include the third offset and the at least one fourth offset.

5. The hardware monitoring method of claim 3, comprising:
arranging the second temperature sensor in an area where a platform controller hub is located to sense the second temperature value for the platform controller hub; and
seeking the first offset corresponding to the second temperature value for the platform controller hub from the storage unit and compensating for the second temperature value based on the first offset, by the complex programmable logic device.

6. The hardware monitoring method of claim 5, wherein the complex programmable logic device is electrically connected to the platform controller hub to allow configuration of at least one of the first and second offsets in the storage unit through the platform controller hub.

7. The hardware monitoring method of claim 1, wherein: the computer system comprises a fan module; and the hardware monitor controls the heat dissipation by accessing a fan speed table and controlling a fan speed of the fan module based on the greater temperature value and the first temperature value.

8. The hardware monitoring method of claim 1, wherein the hardware monitor and the complex programmable logic device are initialized through a platform controller hub.

9. The hardware monitoring method of claim 1, wherein the computer system is a server.

10. The hardware monitoring method of claim 9, wherein the hardware monitor is configured to send an alert signal to the complex programmable logic device upon an operational parameter of the server exceeding a default value, and the complex programmable logic device is configured to cease data reading operations according to the alert signal.

11. A hardware monitoring system for a computer system, comprising:
a hardware monitor, having a first temperature sensor for sensing a first temperature value of a first temperature area; and
a complex programmable logic device electrically connected to the hardware monitor, the complex programmable logic device having a second temperature sensor for sensing a second temperature value of a second temperature area,
wherein the complex programmable logic device is configured to read and compensate for the second temperature value, and the hardware monitor is configured to read the first temperature value and the compensated second temperature value and to control heat dissipation of the computer system based on the first temperature value and the compensated second temperature value,
wherein the complex programmable logic device is further electrically connected to an expandable component which is connected to a third temperature sensor for sensing a third temperature value of a third temperature area,
wherein the complex programmable logic device is configured to read the third temperature value from the expandable component and compensate for the third temperature value,
wherein the complex programmable logic device is further configured to compare the compensated third temperature value with the compensated second temperature value and feeds back a greater temperature value of the compensated second and third temperature values to the hardware monitor, and
wherein the hardware monitor is configured to control heat dissipation of the computer system based on the greater temperature value and the first temperature value.

12. The hardware monitoring system of claim 11, wherein the complex programmable logic device further comprises:
a first $I^2C$ interface for electrically connecting to the expandable component to allow reading of the third temperature value via the first $I^2C$ interface;
a second $I^2C$ interface for electrically connecting to the second temperature sensor to allow reading of the second temperature value via the second $I^2C$ interface; and
a first system management bus interface for electrically connecting to the hardware monitor to provide the greater temperature value to the hardware monitor.

13. The hardware monitoring system of claim 11, wherein the complex programmable logic device further comprises a storage unit for storing the second temperature value and third temperature value; the storage unit is further used to store a first offset and a second offset; and the complex programmable logic device is configured to compensate for the second temperature value based on the first offset and to compensate for the third temperature value based on the second offset.

14. The hardware monitoring system of claim 13, wherein the complex programmable logic device further comprises:
a second system management bus interface for electrically connecting to a platform controller hub to allow configuration of at least one of the offsets stored in the storage unit via the second system management bus interface.

15. The hardware monitoring system of claim 11, wherein:
the third temperature area comprises an I/O area and an area where the expandable component is located;
the second temperature area comprises an area where a platform controller hub is located; and
the first temperature area comprises at least one of: an area where a central process unit is located, an area where a memory is located, an area where the hardware monitor is located, and an area where a thermal diode is located.

16. The hardware monitoring system of claim 11, wherein the computer system comprises a fan module; the hardware monitor further comprises a storage module for storing a fan speed table; and the hardware monitor is configured to control the heat dissipation by accessing the fan speed table and controlling a fan speed of the fan module based on the greater temperature value and the first temperature value.

17. The hardware monitoring system of claim 11, wherein the hardware monitor further comprises:
a platform environment control interface for electrically connecting to the first temperature sensor;
a third system management bus interface for electrically connecting to the complex programmable logic device; and a fourth system management bus interface for electrically connecting to a platform controller hub to allow initialization of the hardware monitor via the fourth system management bus interface.

* * * * *